Dec. 7, 1965 J. R. PATMORE 3,222,607

TRANSISTOR AMPLIFIER CIRCUIT

Filed Feb. 20, 1964 2 Sheets-Sheet 1

United States Patent Office 3,222,607
Patented Dec. 7, 1965

3,222,607
TRANSISTOR AMPLIFIER CIRCUIT

James R. Patmore, Neptune, N.J., assignor to Electronic Associates Inc., Long Branch, N.J., a corporation of New Jersey Filed Feb. 20, 1964, Ser. No. 346,318
7 Claims. (Cl. 330—9)

Figure 1:
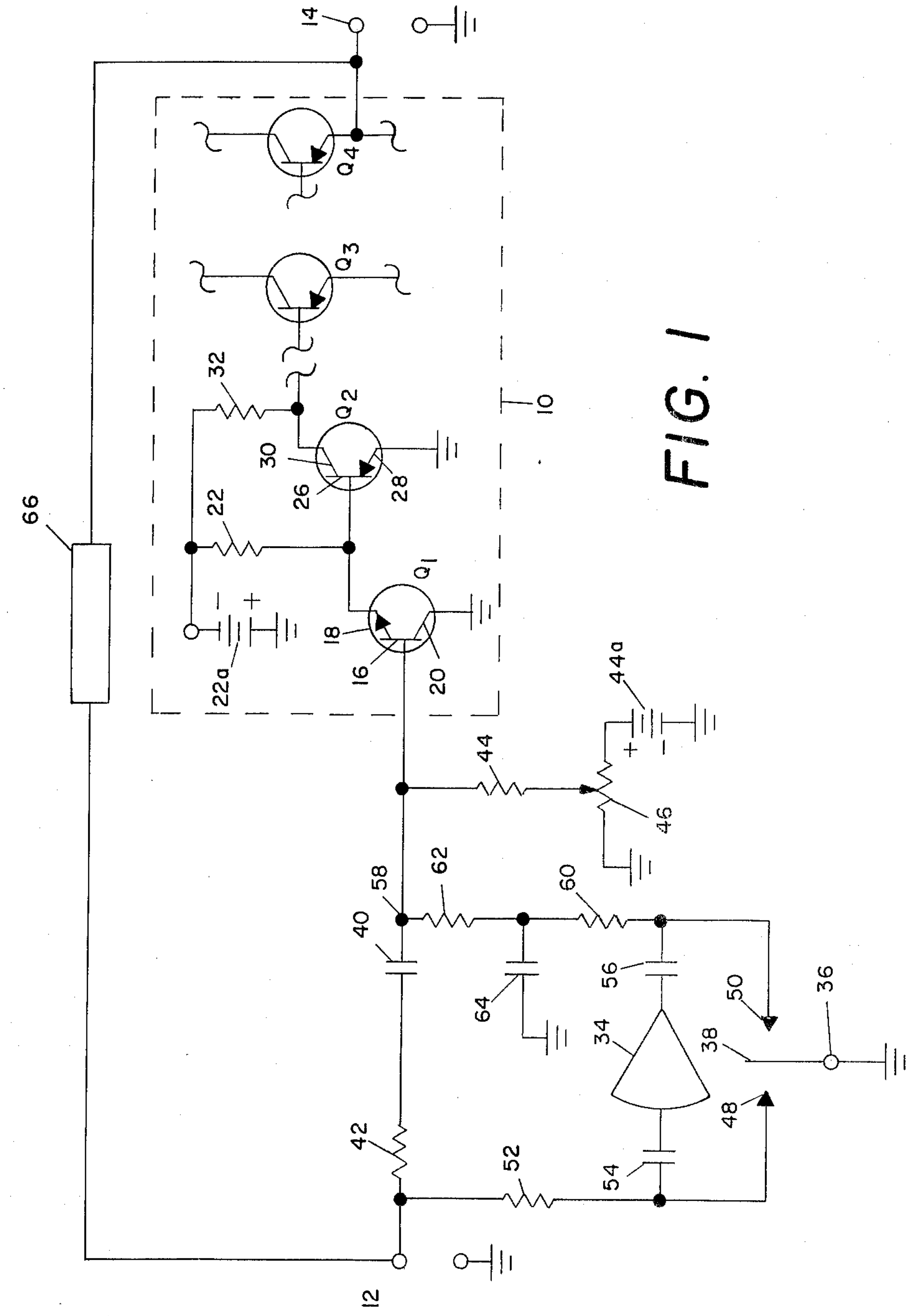

This invention relates generally to amplifier circuits and more particularly to direct coupled signal amplifier systems which utilize transistors.

This is a continuation-in-part of application Serial No. 113,721, filed May 31, 1961, now abandoned.

The amplifiers used in electronic analog computers are required to be capable of functioning as summing devices and integrators, for example. In such applications the amplifiers are usually in the form of a stabilized direct coupled amplifier system or "operational amplifier" comprising a multistage direct coupled amplifier and an A.C. stabilizing amplifier. Such amplifier systems must have a very high degree of stability and retain their desired characteristics over a long period of time in order to provide dependable operation. When semi-conductor devices such as transistors are used as the amplifying elements, a particularly troublesome cause of "drift" or change in characteristics of the amplifier system has been the temperature sensitivity of such transistors. Many solutions have been proposed but have been discarded as a result of their being too complex or costly.

Therefore, it is an object of this invention to improve the operation and stability of a direct coupled transistor amplifier system without undue expense or complexity.

Another object of this invention is to provide for automatic compensation of thermally induced variations in the characteristics of the transistors of a direct coupled transistor amplifier system.

A further object of this invention is to provide for a stable direct coupled semiconductor amplifier system utilizing semiconductor devices of opposite conductivity types.

The present invention contemplates the use of an amplifier system comprising a first and a second semiconductor device of opposite conductivity types. Each of the semiconductor devices may be a transistor having an emitter, a base and a collector. A signal input circuit is connected to the base of the first transistor which has its collector grounded and is in an emitter-follower configuration. The second transistor is connected for grounded emitter operation and a load resistor is connected between its collector and a point of fixed reference potential. The emitter of the first transistor is directly connected to the base of the second transistor so that an output signal is derived from the collector of the second transistor. Means are provided for biasing both of the transistors in a forward direction.

In accordance with the present invention, there is provided a stabilized direct coupled amplifier system comprising a multistage direct coupled amplifier and means including an A.C. stabilizing amplifier. In addition, a feedback circuit is connected between an output terminal and an input terminal of the amplifier system. D.C. input signals which vary with time are applied to the input terminal and then conducted to an input stage of the multistage amplifier which includes a first and a second transistor of opposite conductivity types. The first transistor is connected in an emitter-follower configuration to provide at the input terminal a high input impedance; and at its emitter a low output impedance. The second transistor is connected in a common emitter configuration with the base thereof directly connected to the emitter of the first transistor. In addition, the collector of the first transistor is connected to the emitter of the second transistor and to a point of fixed reference potential, such as ground.

The input D.C. signals which vary with time are amplified by the first and second transistors and then are applied to the next succeeding stage. The base-to-emitter junction voltage ($V_{BE}$) of each of the transistors changes as a function of temperature. In accordance with the invention, the transistors are connected so that a change in $V_{BE}$ in one of the transistors is directly cancelled out by a similar but opposite change in $V_{BE}$ of the other transistor, so that the amplified D.C. signals are substantially unaffected by the thermal variations in the first and second transistors.

The foregoing cancellation of changes in $V_{BE}$ occur when the characteristics of the first and second transistors are substantially identical such as when both of these transistors are made of germanium, for example. However, it is known in the art that transistors made of silicon are superior to germanium transistors in that they have substantially lower collector leakage currents ($I_{CO}$). However, it is only feasible to use silicon transistors of the NPN type since PNP silicon transistors are extremely costly as compared with the NPN type and with both types of germanium transistors. Thus, it is desirable to utilize a silicon NPN transistor as either the first or the second transistor of the input stage of the multistage amplifier while using a PNP germanium transistor as the remaining transistor of the input stage. However, the base-to-emitter voltage ($V_{BE}$) of the silicon transistor is greater than that of the germanium transistor. Therefore, as temperature changes, the change in $V_{BE}$ of the germanium transistor would not be sufficient to cancel the change in $V_{BE}$ of the silicon transistor. Thus, in accordance with a modification of the invention, a diode is connected in series circuit relation with the emitter of the germanium transistor and is poled so that the forward direction of the diode is in the same direction as the forward direction of the emitter-base junction of the germanium transistor. The diode is selected to have a forward direction potential drop which, when added to the base-to-emitter voltage of the germanium transistor, provides a total voltage drop substantially equal to the base-to-emitter voltage of the silicon transistor. In this manner, as temperature varies, the change in $V_{BE}$ of the silicon transistor will be substantially cancelled by the total voltage drop of the diode plus the $V_{BE}$ of the germanium transistor.

As will later be explained more in detail a change in the collector leakage current ($I_{CO}$) in one of the transistors may be partially or wholly cancelled out by a similar but opposite change in the other transistor. Such cancellation occurs since the collector leakage current of the first transistor as amplified is opposite in direction to that of the unamplified collector leakage current of the second transistor and such leakage currents are effectively subtracted. This cancellation or subtraction occurs as previously described as a result of the connections of the transistors of opposite conductivity types.

Figure 2:
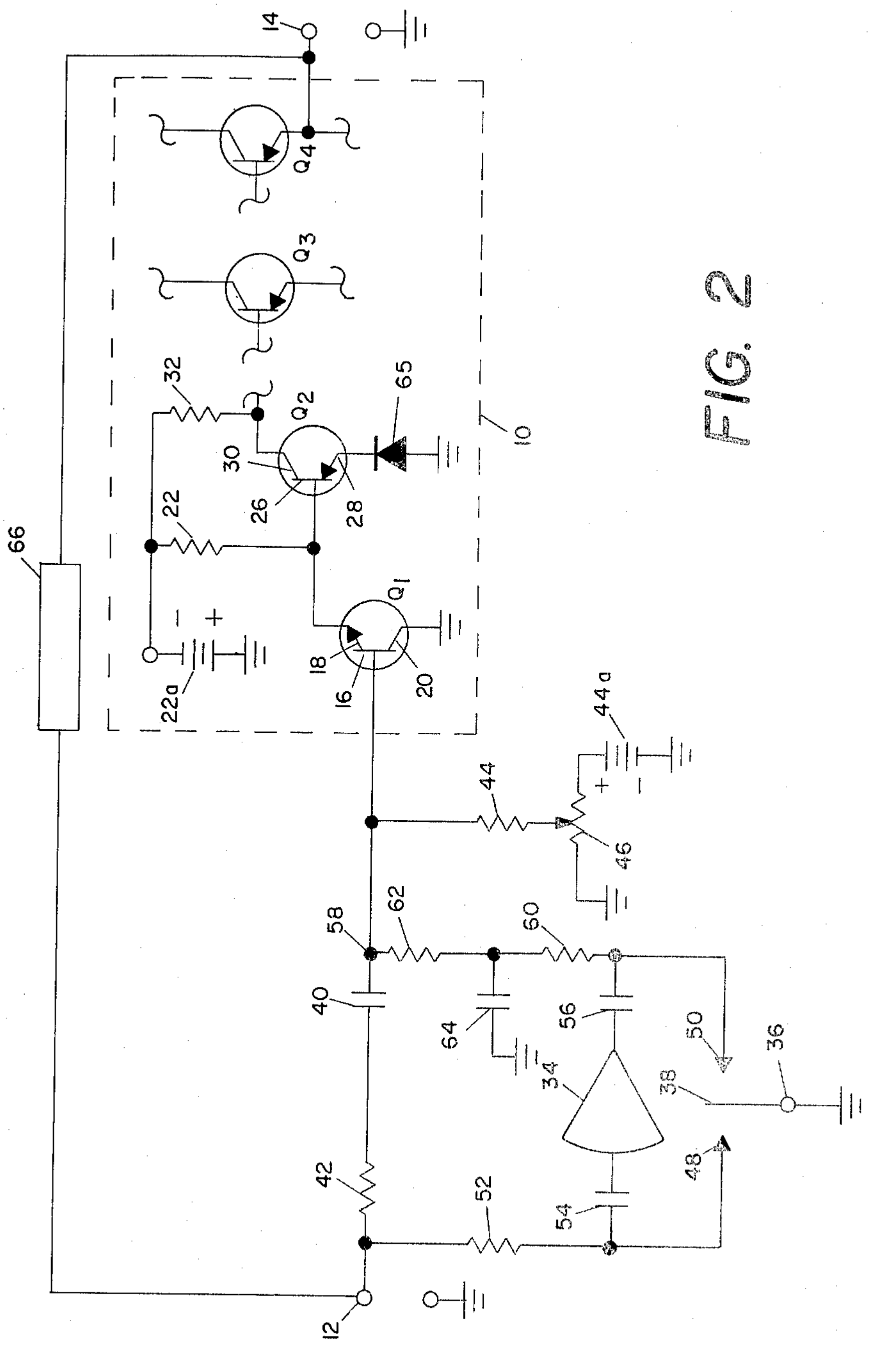

The above and other objects, features and advantages will be set forth with greater particularity in the following detailed description taken in conjunction with the accompanying drawings in which:

FIG. 1 is a schematic representation of a direct coupled transistor amplifier system having inherent drift eliminating characteristics in accordance with the invention; and FIG. 2 is a schematic representation of a direct coupled transistor amplifier system in accordance with a modification of the invention.

Referring now to FIG. 1, there is shown within the rectangle 10 a multistage direct coupled amplifier having an input terminal 12 and an output terminal 14. Amplifier 10 includes a series of transistor stages generally indicated by the reference character Q, with a numeric subscript indicating the sequential position of the transistor from the input end. An input stage comprises a first transistor $Q_1$ and a second transistor $Q_2$. Transistor $Q_1$ is of the NPN type and has a base 14, an emitter 18 and a collector 20. Collector 20 is connected to ground, while emitter 18 is connected to a suitable source of potential, such as a battery 22*a*, by way of a resistor 22. The second transistor $Q_2$ is of the PNP type and has a base 26, an emitter 28 and a collector 30. Emitter 28 is shown connected to ground, while collector 30 is connected to the negative side of battery 22*a* by way of a load resistor. The subsequent transistor stages are nominally designated as $Q_3$–$Q_n$. At 35 there is shown a conventional capacitance coupled A.C. stabilizing amplifier 34. Operating in conjunction with amplifier 34 is a synchronous vibrator-rectifier 36 having an armature 38 and a coil (not shown) which is applied with an automatic current potential of suitable frequency, e.g. 100 cycles per second.

The input circuit to the base 16 of transistor $Q_1$ includes a base current blocking capacitor 40 and a resistor 42 connected in series circuit relation between the input terminal 12 and the base 16. In addition, the base 16 is connected by way of a resistor 44 and a potentiometer 46 to the positive side of a battery 44*a*, the negative side of which is connected to ground. In addition, the remaining end of the potentiometer 46 is connected to ground.

The vibrator-rectifier 36 is provided with a set of contacts 48 and 50 cooperating with armature 38 to convert a direct current signal potential taken from the input terminal 12 by way of a resistor 52 into a pulsating direct current potential having an amplitude proportional to the direct current signal. This pulsating potential is applied through a coupling capacitor 54 to the first stage of amplifier 34 and appears after amplification by the amplifier as a modulated output signal at a coupling capacitor 56.

The capacitor 56 connects the output of amplifier 34 to the contact 50. Since armature 38 connects contact 50 to ground 180° out of phase with respect to contact 48, the amplifier output signal at capacitor 56 is reconverted or demodulated to a direct current potential. This demodulated signal is then applied to terminal 58 after being filtered in a conventional low-pass filter comprising capacitors 60 and 62 and a capacitor 64.

The demodulated end filtered signal applied to terminal 58 serves as a correction or balancing signal for the D.C. amplifier. It will be understood that this correction signal or voltage is of the same polarity as the input D.C. signal which varies with time as applied to input terminal 12. Thus, the correction voltage is introduced to the amplifier 10 in such a manner with respect to amplifier gain controlled by the transistor $Q_1$ as to compensate to a considerable extent for the effects of drift. It is well understood by those skilled in the art that drift is due to variations in circuit components caused by aging of the components, temperature changes, etc. The balancing signal is impressed on the base 16 to control the emitter current of transistor $Q_1$ and a suitable feedback element or circuit 66 is connected between the output 14 and the input 12 of the amplifier.

Since the input signal means which apply the D.C. signals to input terminal 12 is a low power signal source, it is desirable that the amplifier provide a high input impedance to prevent the loading of that signal source. In addition, an amplifier stage having a low output impedance is desirable for matching the input impedance of succeeding stages. The first transistor $Q_1$ is connected to operate as a common collector or emitter-follower configuration which is known to have the desired high input and low output impedance characteristics. The second transistor $Q_2$ is connected as a common emitter stage which provides power amplification. The resistors 22, 32, 44 and 46 are selected in accordance with the transistors used and the voltages of the batteries 22*a* and 44*a* so that both of the transistors or devices $Q_1$ and $Q_2$ are biased in a forward direction.

In dealing with the amplification of low power D.C. signals over a period of time, it is extremely important to obviate the sources of error signal within the amplifier resulting, for example, from drift caused by temperature changes. It is a well-known property of semiconductor materials such as germanium and silicon that the voltage drop from base to emitter ($V_{BE}$) varies inversely as the temperature. This property is a characteristic of the semiconductor material and is not attributable to impurities and is known to be relatively constant from transistor to transistor within a type.

In the embodiment of the invention illustrated in FIG. 1, the drift caused by temperature induced change in $V_{BE}$ is compensated for by using transistors of opposite conductivity types (PNP and NPN) with the emitter 18 of the first transistor $Q_1$ being directly connected to the base 26 of the second transistor $Q_2$. These transistors are preferably of the same semiconductor material, such as germanium, for example, each having a similar $V_{BE}$. The $V_{BE}$ of each transistor varies inversely with temperature for a given bias current, which bias current is chosen to lie within the operating range of the device. That is, an increase in temperature tends to drive the base 16 of transistor $Q_1$ in a negative (less positive) direction. As an illustration, assuming a $V_{BE}$ of 0.6 volt for both transistors, the $V_{BE}$ for the second transistor $Q_2$ will be −0.6 volt at the base 26. This voltage is also the voltage at the emitter 18 of transistor $Q_1$. Therefore, with the emitter base junction of transistor $Q_1$ forward biased, the base 16 is at +0.6 volt. As temperature rises, $V_{BE}$ of the second transistor $Q_2$ changes from −0.6 to −0.5 volt. At the same time $V_{BE}$ of the first transistor $Q_1$ will change from +0.6 to +0.5 volt. In this manner the changes in $V_{BE}$ cancel each other so that base 16 of transistor $Q_1$ remains at the same voltage with respect to ground and the effects of temperature change in this respect are negated.

Yet another source of drift results from changes in the collector leakage current $I_{CO}$ of the first and second transistors $Q_1$ and $Q_2$. This leakage current $I_{CO}$ varies directly as the temperature. Although $I_{CO}$ may vary considerably from transistor to transistor within a semiconductor material type, this characteristic is one which emitter voltage $V_{CE}$ of the first transistor $Q_1$ is the base-may be matched. As shown in FIG. 1 the collector-to-to-emitter voltage of the second transistor $Q_2$ and therefore the $I_{CO}$ of the first transistor $Q_1$ may be maintained at a substantially low value by the low potential $V_{BE}$ of the second transistor $Q_2$. With the $I_{CO}$ of transistor $Q_1$ of desired low magnitude its amplification by the transistor may produce at its emitter a resultant current which may be selected to be substantially equal to the unamplified $I_{CO}$ appearing at the base of transistor $Q_2$. The $I_{CO}$ of NPN transistor $Q_1$ may be described as "positive" and as flowing from base 16 to collector 20. The $I_{CO}$ in PNP transistor $Q_2$ may be described as "negative" and as flowing from the cellector 30 to the base 26. With the emitter-follower configuration of transistor $Q_1$ there is no inversion, so that the leakage current increases in a positive direction with increase in temperature. On the other hand, the second transistor $Q_2$, with increase in temperature, provides an increase in leakage current in the negative direction. Therefore, substantially total cancellation of the temperature induced changes in $I_{CO}$ occurs if the amplified change in $I_{CO}$ of transistor $Q_1$ is equal in magnitude to the unamplified change in $I_{CO}$ of the transistor $Q_2$. In the event that these changes are not equal there will be produced at least a partial cancellation or subtraction of one change of $I_{CO}$ with the other change.

Referring now to the modification of the invention as shown in FIG. 2, there is illustrated a stabilized direct coupled amplifier system substantially identical to the amplifier system shown in FIG. 1. The various parts of FIG. 2 which are identical to those of FIG. 1 have been identified by corresponding reference characters. In FIG. 2 the first transistor $Q_1$ is constructed of silicon, while the transistor $Q_2$ is of germanium. It will be remembered that in FIG. 1 the transistors $Q_1$ and $Q_2$ were both assumed to be made of germanium. The advantage of the silicon NPN transistor $Q_1$ is that it has a substantially lower collector leakage current than a corresponding NPN germanium transistor. As previously described, a low collector leakage curent for transistor $Q_1$ is particularly important since that current is amplified by that transistor and it is desired that the resultant current be substantially equal to the collector leakage current of transistor $Q_2$.

However, as well known, the base-to-emitter voltage $V_{BE}$ of a silicon transistor ($Q_1$) is greater than that of a germanium transistor ($Q_2$). Therefore, there is provided a silicon diode 65 connected between ground and the emitter of transistor $Q_2$. With the anode of diode 65 connected to ground and its cathode connected to emitter 28 it will be understood that this diode is poled so that its forward direction is in the same direction as the forward direction of the emitter-base junction of germanium transistor $Q_2$. As previously described with that emitter-base junction forward biased, it will be understood that the diode will also be forward biased. In addition, diode 65 is selected to have a forward potential drop which when added to the $V_{BE}$ of transistor $Q_2$ provides a total voltage drop substantially equal to the $V_{BE}$ of the silicon transistor $Q_1$. Thus, as temperature varies the potential drop across diode 65 varies as well as the $V_{BE}$ of each of transistors $Q_1$ and $Q_2$. In accordance with the invention, the resultant voltage drop of the diode potential and the $V_{BE}$ of transistor $Q_2$ will substantially cancel out the $V_{BE}$ of the silicon transistor $Q_1$. In this way, the D.C. signals which are being amplified are substantially unaffected by D.C. drift caused by the change in $V_{BE}$ resulting from thermal variations in the transistors.

With the silicon transistor $Q_1$ having a substantially low value of collector leakage current, that current when amplified may be aproximately equal to the unamplified collector leakage current of the germanium transistor $Q_2$. In this way for an increase in temperature, transistor $Q_2$ produces an increase in leakage current in the negative direction, while transistor $Q_1$ produces an increase in leakage current in the positive direction and such temperature induced changes may be substantially cancelled out. It will be understood that at least partial cancellation will occur if such changes are not substantially equal.

Now that the principles of the invention have been explained, it will be understood that many modifications may be made. For example, as shown in FIG. 1, transistor $Q_1$ and $Q_2$ may be of the PNP and NPN types respectively. In addition, in FIG. 2 transistor $Q_2$ may be a silicon NPN transistor, while transistor $Q_1$ may be a germanium PNP transistor. Thus, a silicon diode (not shown) would be connected in series circuit relation with the PNP germanium transistor $Q_1$ with its cathode connected to emitter 18 and its anode connected to base 26.

What is claimed is:

1. A stabilized direct coupled amplifier system comprising in combination, an input terminal and an output terminal, a multistage direct coupled amplifier having at least an input stage and an output stage, a feedback circuit connected between said output terminal and said input terminal, input signal means for applying to said input terminal D.C. signals which vary with time, means including an A.C. stabilizing amplifier coupled between said input terminal and said input stage, said input stage including a first and a second transistor of opposite conductivity types each having similar base-to-emitter junction voltages which vary similarly as a function of temperature and each having at least a base, an emitter and a collector, means connecting said base of said first transistor to said input terminal, said first transistor being connected in an emitter follower configuration to provide at said input terminal a high input impedance and at its emitter electrode a low output impedance, said second transistor being connected in a common emitter configuration with the base thereof directly connected to said emitter of said first transistor, means directly connecting said collector of said first transistor and said emitter of said second transistor to a point of reference potential, and means for deriving from said collector of said second transistor said D.C. signals which have been amplified for application to the next succeeding stage of said multistage amplifier which amplified D.C. signals have been substantially unaffected by D.C. drift caused by the thermal variations in said first and said second transistors.

2. The amplifier system of claim 1 in which there is provided an input capacitor connected between said input terminal and said base of said first transistor for blocking D.C. current from flowing between said input terminal and said base of said first transistor.

3. A stabilized direct coupled amplifier system comprising in combination, an input terminal and an output terminal, a multistage direct coupled transistor amplifier having at least an input stage and an output stage, a feedback circuit connected between said output terminal and said input terminal, analog input signal means for applying to said input terminal D.C. signals which vary with time, means including an A.C. stabilizing amplifier coupled between said input terminal and said input stage, said input stage including a first and a second transistor of opposite conductivity types, each having similar base-to-emitter junction voltages which vary similarly as a function of temperature and each having at least a base, an emitter and a collector electrode, means including a capacitor connecting said input terminal to said base of said first transistor for blocking D.C. current from flowing between said input terminal and said base of said first transistor, said first transistor being connected in an emitter follower configuration to provide at its base electrode a high input impedance and at its emitter electrode a low output impedance, said second transistor being connected in a common emitter configuration with the base electrode thereof directly connected to said emitter electrode of said first transistor, means directly connecting said collector of said first transistor and said emitter of said second transistor to a point of reference potential, and means for deriving from said collector of said second transistor said D.C. signals which have been amplified by said input stage for application to the next succeeding stage of said multistage amplifier whereby the base-to-emitter junction voltage of each of said first and second transistors change as a function of temperature and each such change in one of said transistors is effective to directly cancel out a similar but opposite change in the other transistor to provide said amplified D.C. signals substantially unaffected by the thermal variations in said first and said second transistors.

4. The amplifier system of claim 3 in which one of said first and second transistors is of the silicon type and in which there is provided a silicon diode connected in series circuit relation with the emitter of said other one of transistors to provide a forward direction potential drop which adds to the base-to-emitter voltage drop of said other transistor to produce a total voltage drop substantially equal to the base-to-emitter voltage drop of said silicon transistor.

5. A stabilized direct coupled amplifier system comprising, an input terminal and an output terminal, a multistage direct coupled amplifier having at least an input stage including a first and a second transistor of opposite conductivity types, feedback means connected between said output terminal and said input terminal, input signal means for applying D.C. signals to said input terminal, means including a stabilizing amplifier coupled between said input terminal and said input stage, means connecting the base of said first transistor to said input terminal, said first transistor being connected in an emitter follower configuration, said second transistor being connected in a common emitter configuration with the base thereof connected to the emitter of said first transistor, means connecting the collector of said first transistor and the emitter of said second transistor to a point of reference potential, one of said first and second transistors being of the silicon type, a diode connected in series circuit relation with the emitter of the other one of said transistors to provide a forward direction potential drop which adds to the base to emitter voltage drop of said other transistor to produce a total voltage drop substantially equal to the base to emitter voltage drop of said silicon transistor, and means for deriving from said collector of said second transistor said D.C. signals which have been amplified for application to the next succeeding stage of said multistage amplifier which amplified D.C. signals have been substantially unaffected by D.C. drift caused by the thermal variations in said transistors.

6. A stabilized direct coupled amplifier system comprising, an input circuit and an output circuit, a multistage direct coupled amplifier having at least an input stage including a first and second transistor of opposite conductivity types, feedback means connected between said input and output circuits, input signal means for applying D.C. signals which vary with time to said input circuit, means including a stabilizing amplifier coupled between said input circuit and said input stage, said second transistor being connected in a common-emitter configuration with the base thereof directly connected to the emitter of said first transistor, means connecting the collector of said first transistor and the emitter of said second transistor to a point of reference potential, one of said first and said second transistors being of the silicon type, a silicon diode connected in series circuit relation with the emitter of the other one of said transistors and poled so that the forward direction of said diode is the same direction as the forward direction of the emitter base junction of said other transistor to provide a forward direction potential drop which adds to the base-to-emitter voltage drop of said other transistor to produce a total voltage drop substantially equal to the base-to-emitter voltage drop of said silicon transistor, and means connecting the collector of said second transistor to an input terminal of the next succeeding stage of said multistage amplifier to apply thereto amplified D.C. signals which have been substantially unaffected by D.C. drift caused by the thermal variations in said transistors.

7. The amplifier system of claim 6 in which said first transistor is of the silicon type and said second transistor is of the germanium type and in which said diode is of the silicon type having its cathode directly connected to said emitter of said germanium transistor and its anode connected to said point of reference potential.

References Cited by the Examiner

UNITED STATES PATENTS

| | | | |
|---|---|---|---|
| 2,968,005 | 1/1961 | Patmore | 330—10 X |
| 3,015,074 | 12/1961 | Taskett | 330—9 |

ROY LAKE, *Primary Examiner.*